United States Patent
Hunter

(10) Patent No.: US 6,777,258 B1
(45) Date of Patent: Aug. 17, 2004

(54) CONDUCTIVE ETCH STOP FOR ETCHING A SACRIFICIAL LAYER

(75) Inventor: James A. Hunter, Campbell, CA (US)

(73) Assignee: Silicon Light Machines, Inc., Sunnyvale, CA (US)

( * ) Notice: Subject to any disclaimer, the term of this patent is extended or adjusted under 35 U.S.C. 154(b) by 0 days.

(21) Appl. No.: 10/187,028

(22) Filed: Jun. 28, 2002

(51) Int. Cl.⁷ ............................................. H01L 21/00
(52) U.S. Cl. ............................. 438/48; 438/52; 438/740
(58) Field of Search ............................. 438/48, 52, 53, 438/700, 706, 712, 740

(56) References Cited

U.S. PATENT DOCUMENTS

| | | | |
|---|---|---|---|
| 5,661,592 A | | 8/1997 | Bornstein et al. |
| 5,789,264 A | * | 8/1998 | Chung .......................... 438/52 |
| 6,020,215 A | * | 2/2000 | Yagi et al. ..................... 438/52 |
| 6,238,581 B1 | | 5/2001 | Hawkins et al. |
| 2002/0019064 A1 | * | 2/2002 | Hara .............................. 438/3 |
| 2002/0047172 A1 | * | 4/2002 | Reid ........................... 257/415 |
| 2003/0010746 A1 | * | 1/2003 | Gutierrez et al. .............. 216/2 |
| 2003/0030118 A1 | * | 2/2003 | Kim ........................... 257/414 |
| 2003/0054588 A1 | | 3/2003 | Patel et al. |
| 2003/0138986 A1 | * | 7/2003 | Bruner ......................... 438/52 |

OTHER PUBLICATIONS

James A. Hunter and Bryan Staker "Reduced Formation of Asperities in Contact Micro–Structures" U.S. patent application No. Ser. 10/187,159 filed Jun. 28, 2002.
PCT International Search Report for PCT/US03/17027 mailed Sep. 2, 2003; total of 2 sheets.

* cited by examiner

Primary Examiner—Tuan H. Nguyen
(74) Attorney, Agent, or Firm—Okamoto & Benedicto LLP

(57) ABSTRACT

In one embodiment a micro device is formed by depositing a sacrificial layer over a metallic electrode, forming a moveable structure over the sacrificial layer, and then etching the sacrificial layer with a noble gas fluoride. Because the metallic electrode is comprised of a metallic material that also serves as an etch stop in the sacrificial layer etch, charge does not appreciably build up in the metallic electrode. This helps stabilize the driving characteristic of the moveable structure. In one embodiment, the moveable structure is a ribbon in a light modulator.

18 Claims, 7 Drawing Sheets

CONDUCTIVE ETCH STOP FOR ETCHING A SACRIFICIAL LAYER

BACKGROUND OF THE INVENTION

1. Field Of The Invention

The present invention relates generally to micro devices, and more particularly, but not exclusively, to micromechanical system structures and manufacturing methods.

2. Description Of The Background Art

A micro electromechanical system (MEMS) typically includes micromechanical structures that may be actuated using electrical signals. An example of a MEMS device is the Grating Light Valve™ (GLV) device available from Silicon Light Machines, Inc. of Sunnyvale, Calif. GLV-type devices are described in the following disclosures, which are incorporated herein by reference in their entirety: U.S. Pat. No. 5,311,360 to Bloom et al,; U.S. Pat. No. 5,841,579 to Bloom et al.; and U.S. Pat. No. 5,661,592 to Bornstein et al.

Generally speaking, a GLV-type device is a light modulator. It may be used in various applications including video, printing, and optical switching, for example. A GLV-type device includes an array of moveable structures referred to as "ribbons". A ribbon typically includes a metallic layer formed over a resilient, suspended structure. Under the ribbon is a bottom electrode that works in conjunction with the metallic layer, which serves as a top electrode. An air gap separates the bottom electrode from the metallic layer. Applying a voltage difference between the ribbon and the bottom electrode generates an electrostatic field that pulls the ribbon towards the bottom electrode. Light that impinges on the reflective metallic layer may thus be modulated by reflection or diffraction by controlling the applied voltage.

The response of a GLV-type device to a control signal, such as an applied voltage, is also referred to as its "driving characteristic". As can be appreciated from the foregoing, the better a device's driving characteristic, the better it can modulate light. Thus, it is desirable to have GLV-type device that has a relatively stable driving characteristic.

SUMMARY

In one embodiment, a micro device is formed by depositing a sacrificial layer over a metallic electrode, forming a moveable structure over the sacrificial layer, and then etching the sacrificial layer with a noble gas fluoride. Because the metallic electrode is comprised of a metallic material that also serves as an etch stop in the sacrificial layer etch, charge does not appreciably build up in the metallic electrode. This helps stabilize the driving characteristic of the moveable structure. In one embodiment, the moveable structure is a ribbon in a light modulator.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Moreover, embodiments of the present invention are described herein in the context of a GLV-type device. However, it should be understood that the present invention is not so limited and may also be used in MEMS devices in general or in other micro devices, such as integrated circuits with moveable micromechanical structures. Additionally, it is to be noted that as used in the present disclosure, the terms "over" and "under" refer to the relative placement of two materials that may not be directly in contact with each other; that is, the two materials may be separated by another material or an air gap.

Figure 1:
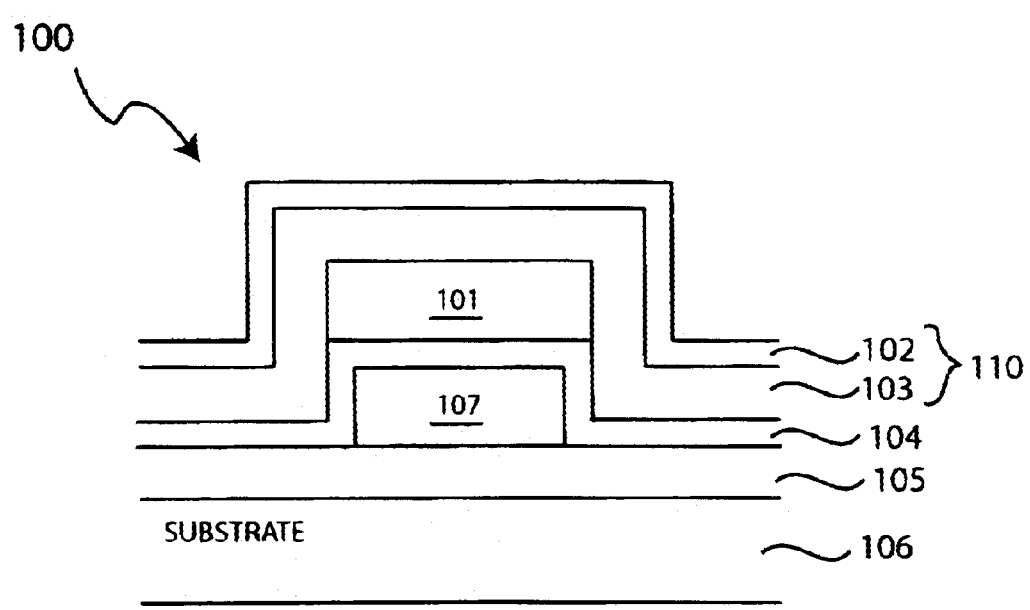
FIG. 1 schematically shows a cross-sectional view of a conventional GLV-type device.

Referring now to FIG. 1, there is shown a schematic representation of a cross-sectional view of a conventional GLV-type device 100. Note that FIG. 1 and all other drawings in the present disclosure are not to scale. Also, although a GLV-type device typically includes more than one ribbon, only one ribbon is shown in the drawings for clarity of illustration.

Device 100 includes a ribbon 110 comprising a resilient structure 103 and a metal layer 102. Metal layer 102 is typically a layer of aluminum, while resilient structure 103 is typically a layer of silicon nitride ($Si_3N_4$). An air gap 101 separates ribbon 110 from a bottom electrode 107. Because ribbon 110 may be flexed towards bottom electrode 107, ribbon 110 may also be referred to as a "moveable structure." Unlike metal layer 102, bottom electrode 107 is typically of a non-metallic material such as polysilicon. The polysilicon is heavily doped with an n-type dopant (e.g., phosphorous) so that it may be used as an electrode. Polysilicon is traditionally thought of as a good electrode material because it is compatible with standard integrated circuit fabrication processes. Additionally, polysilicon is stable at least up to 550° C., the temperature at which an amorphous silicon layer is deposited over bottom electrode 107 as discussed below.

Air gap 101 is typically formed by depositing amorphous silicon in the space occupied by air gap 101 and then isotropically etching the amorphous silicon with xenon difluoride ($XeF_2$). The amorphous silicon is deposited over bottom electrode 107 using a low pressure chemical vapor deposition process at around 550° C. To protect a polysilicon bottom electrode 107 during the etching of the amorphous silicon, a thin silicon dioxide ($SiO_2$) layer 104 is deposited over bottom electrode 107. That is, silicon dioxide layer 104 serves as an etch stop for the amorphous silicon etch. As shown in FIG. 1, bottom electrode 107 is formed over an isolation layer 105 (e.g., silicon dioxide), which in turn is over a substrate 106 (e.g., silicon substrate).

The movement of ribbon 110 may be controlled by applying a voltage difference between ribbon 110 and bottom electrode 107. The voltage difference generates an electric field that pulls ribbon 110 towards bottom electrode 107. Because metal layer 102 is formed of a metallic material that is smooth to light of a particular wavelength or range of wavelengths, incident light of suitable wavelength may be diffracted or reflected off metal layer 102 depending on whether ribbon 110 is pulled or not.

Although device 100 is suitable for most applications, its driving characteristics may change over time. That is, applying the same voltage difference, at different time periods may not result in the same movement of ribbon 110. The inventor has discovered that the use of a non-conductive etch stop (i.e., silicon dioxide layer 104) over bottom electrode 107 contributes to this problem. Because the non conductive etch stop is a dielectric, random ionic charges may build up on the surface of bottom electrode 107 facing the etch-stop. The charge build up may block electric fields generated to move ribbon 110, thereby adversely affecting the driving characteristics of device 100. In an embodiment of the present invention, a bottom electrode is of a metallic material. The metallic material also serves as a conductive etch stop to prevent undesirable charge build up.

FIGS. 2(a)–2(m) schematically show side cross-sectional views of a GLV-type device being fabricated in accordance with an embodiment of the present invention. FIGS. 2(a)–(m) are not drawn to scale.

In FIGS. 2 (a), an isolation layer 205 is deposited over a substrate 206. Substrate 206 may be a silicon substrate while isolation layer 205 may be a layer of silicon dioxide grown to a thickness of 1$\mu$m by thermal oxidation. Isolation layer 205 isolates a subsequently deposited metal layer 207' from substrate 206.

Figure 2A:
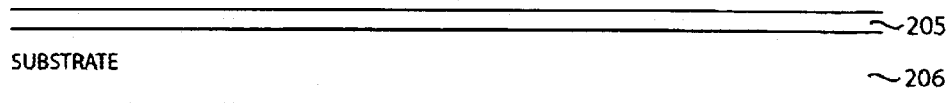
FIGS. 2(a)–(m) schematically show side cross-sectional views of a GLV-type device being fabricated in accordance with an embodiment of the present invention.
Figure 2B:
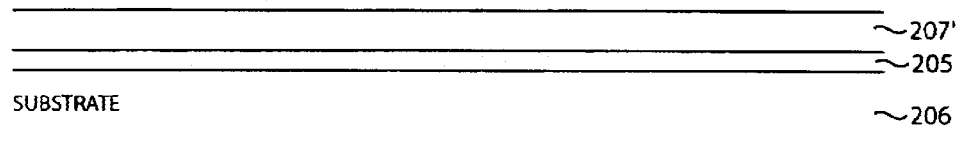

In FIG. 2(b), metal layer 207' is deposited over a isolation layer 205. As discussed below, metal layer 207' may be a layer of titanium deposited to a thickness of about 1000 Angstroms (i.e., $1000 \times 10^{-10}$m) by a physical vapor deposition.

Figure 2C:
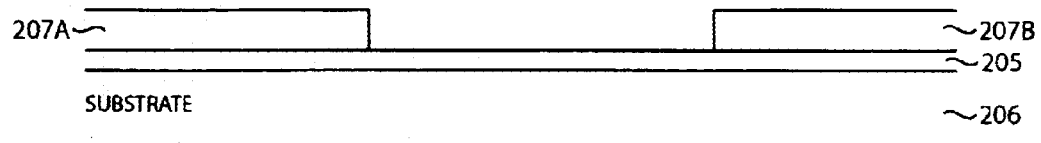

In FIG. 2(c), metallic electrodes 207 (i.e., 207A, 207B) are formed by patterning and etching metal layer 207'. Preferably, a metallic electrode 207 is of a metallic material that has good conductivity. For example, a metallic electrode 207 may have a conductivity of less than 250 $\mu\Omega$-cm. Additionally, a metallic electrode 207 is preferably of a material that is stable over the range of processing temperatures it will be subjected to. For example, a metallic electrode 207 preferably will not melt, sublimate, oxidize, peel, or adversely react with adjacent materials at temperatures up to about 900° C. Because a metallic electrode 207 also serves as an etch stop in a subsequent etching step for removing a sacrificial layer, metallic electrode 207 is preferably of a material that is not appreciably etched by the sacrificial layer etchant.

To help facilitate integration of metallic electrodes 207 in traditional integrated circuit factories, a metallic electrode 207 is preferably of a metallic material that is compatible with standard integrated circuit fabrication processes such as CMOS (Complementary Metal-Oxide Semiconductor). Likewise, a metallic electrode 207 is preferably formable using conventional patterning and etching techniques.

A metallic electrode 207 may be formed by (a) depositing a metal layer over a substrate, (b) patterning and etching the metal layer to form a metallic electrode, and (c) then changing the composition of the metallic electrode by reacting it with another material, referred to as a "source material", at relatively high temperature.

In one embodiment, metallic electrodes 207 comprise titanium nitride (TiN). A metallic electrode 207 of titanium nitride may be formed on, isolation layer 205 by first depositing titanium to a thickness of about 1000 Angstroms by physical vapor deposition. The titanium may then be patterned and etched to form a metallic electrode The formation of the metallic electrode may then be followed, by an ammonia-based rapid thermal processing (RTP) at around 1050° C. for about 30, seconds. The ammonia in the rapid thermal process serves as a source material, providing nitrogen to the metallic electrode of titanium. That is, the ammonia reacts with the titanium to form titanium-nitride.

Forming a metallic electrode 207 of titanium-nitride by first patterning and etching a titanium layer and then exposing the titanium to a nitrogen source has several advantages. For one the resulting titanium-nitride reacts with an isolation layer 205 of silicon dioxide to form titanium-oxide at their interface. This creates good adhesion between a metallic electrode 207 and an: isolation layer 205. Additionally, by patterning and etching the titanium before reacting the titanium with ammonia, all sidewalls of a metallic electrode 207 are exposed to the ammonia, making the sidewalls rich with titanium-nitride.

Depending on the application, a metallic electrode 207 of titanium-nitride may also be formed by reactively sputtering titanium in a process chamber containing nitrogen.

Titanium-nitride has several properties that make it suitable as a metallic electrode 207 in the example fabrication processes of FIGS. 2(a)–2(m). Titanium-nitride has good conductivity (about 50–100 $\mu\Omega$-cm), is stable at temperatures at least up to about 1200° C., does not react with silicon (the material used as sacrificial layer in one embodiment) at temperatures at least up to about 900° C., is compatible with standard integrated circuit fabrication processes, has good adhesion, is optically smooth to light in the ultra violet (UV) to infra-red (IR) wavelengths. Additionally, titanium-nitride is not appreciably etched by a noble gas fluoride etchant, such as a xenon difluoride etchant used to remove a sacrificial layer of amorphous silicon in one embodiment. Thus, a metallic electrode 207 of titanium-nitride may also serve as a conductive etch stop in the amorphous silicon etch. In light of the present disclosure, those of ordinary skill in the art can use other metallic materials for specific applications. For example, tungsten-silicide ($WSi_2$) may also be used as a metallic electrode material.

Figure 2D:
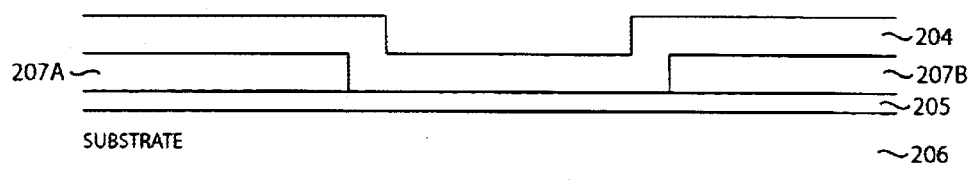

Continuing in FIG. 2(d), a protection layer 204 is deposited over the sample of FIG. 2(c). As described below, some metallic electrodes 207 may be used as a bottom metallic electrode under a ribbon while other metallic electrodes 207 may be used as a metal pad for electrically coupling a ribbon to a lead array (see FIG. 2(m)). In the example of FIGS. 2 (a)–2(m), a metallic electrode 207 to be used as a bottom electrode is referred to as a "metallic electrode 207A", while a metallic electrode 207 to be used as a metal pad is referred to as a "metallic electrode 207B". Protection layer 204 protects a metallic electrode 207B during the etching of a metallic electrode 207A. In one embodiment, protection layer 204 is a layer of silicon dioxide deposited to a thickness of about 2000 Angstroms by plasma-enhanced chemical vapor deposition.

Figure 2E:
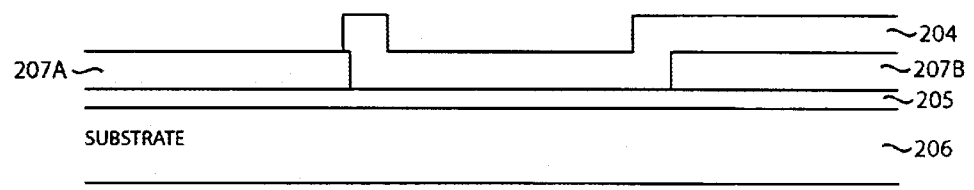

In FIG. 2(e), protection layer 204 is patterned and etched to expose a metal electrode 207A. In one embodiment, protection layer 204 is etched using an etchant comprising of hydrofluoric acid (HF).

Figure 2F:
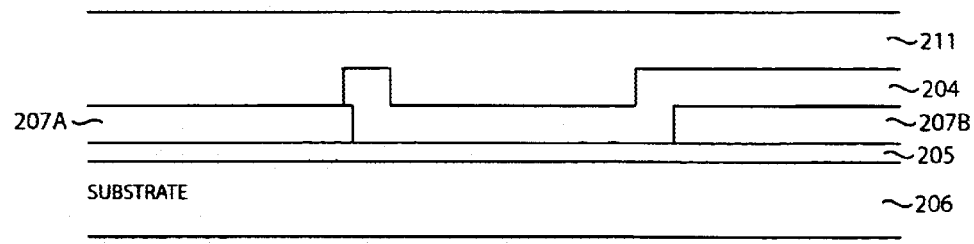

In FIG. 2(f), a sacrificial layer 211 is deposited over the sample of FIG. 2(e). In one embodiment, sacrificial layer 211 is a layer of amorphous silicon deposited to a thickness of about 1$\mu$m to 3$\mu$m by low pressure chemical vapor deposition at around 550° C. Sacrificial layer 211 will be subsequently removed to form an air gap 201 between a metallic electrode 207A and a ribbon 200 (see FIG. 2(m)).

Figure 2G:
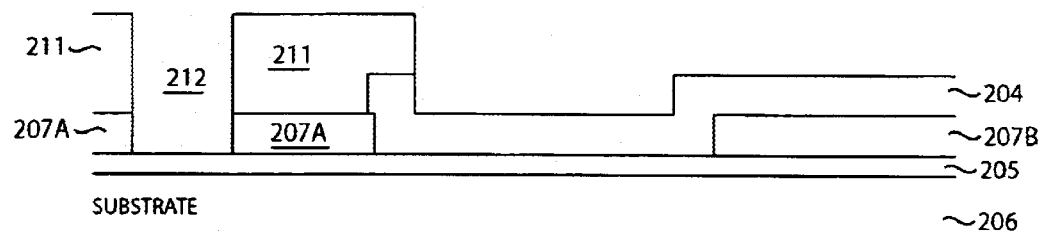

In FIG. 2(g), sacrificial layer 211 is patterned and etched to remove portions of sacrificial layer 211 not over a metallic electrode 207A and to dig a cavity 212. Cavity 212 is subsequently filled with ribbon material to securely anchor a ribbon 200.

Figure 2H:
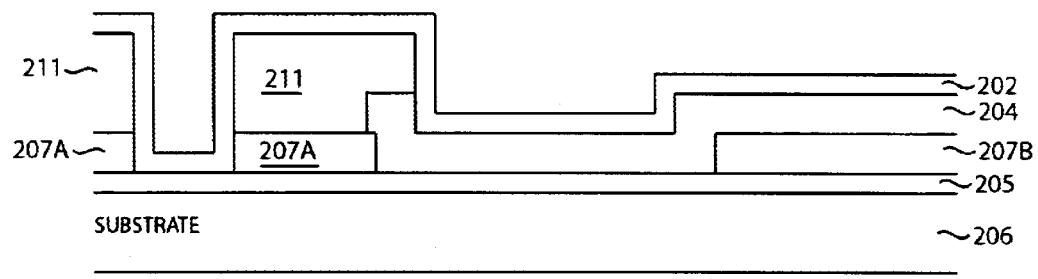

In FIG. 2(h), a ribbon material 202 is deposited over the sample of FIG. 2(g). Ribbon material 202 is preferably a resilient material that may be repeatedly flexed without breaking. In one embodiment, ribbon material 202 comprises silicon nitride deposited to a thickness of about 1000 Angstroms by low pressure chemical vapor deposition.

Figure 2I:
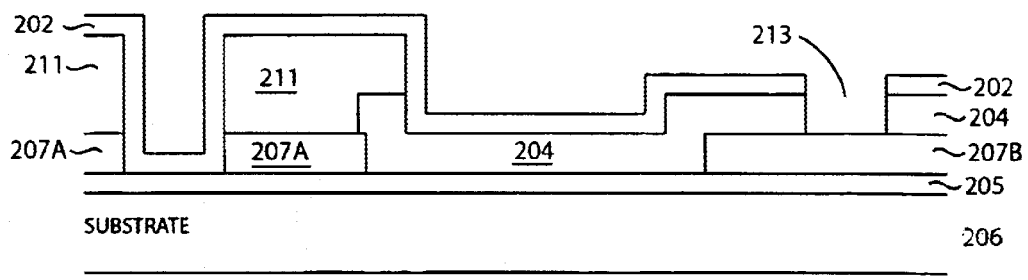

In FIG. 2(i), a via 213 is formed through ribbon material 202 and protection layer 204. Via 213 exposes a metallic electrode 207B. Via 213 is subsequently filled with a metal for coupling an external signal, such as a control signal, to a top electrode of a ribbon 200.

Figure 2J:
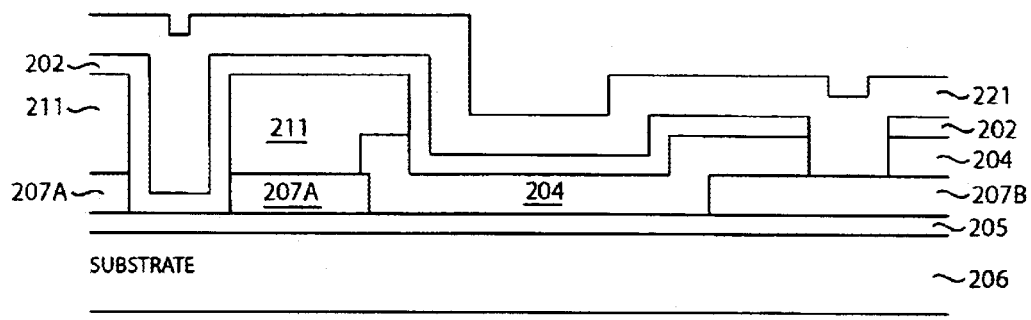

In FIG. 2(j), a metal layer 221 is deposited over the sample in FIG. 2(i). Metal layer 221 is relatively thick compared to a subsequently deposited metal layer 222 (see FIG. 2(l)). This allows the deposition of metal layer 221 to have adequate step coverage to fill via 213. In one embodiment, metal layer 221 comprises aluminum deposited to a thickness of about 0.5µm by physical vapor deposition.

Figure 2K:
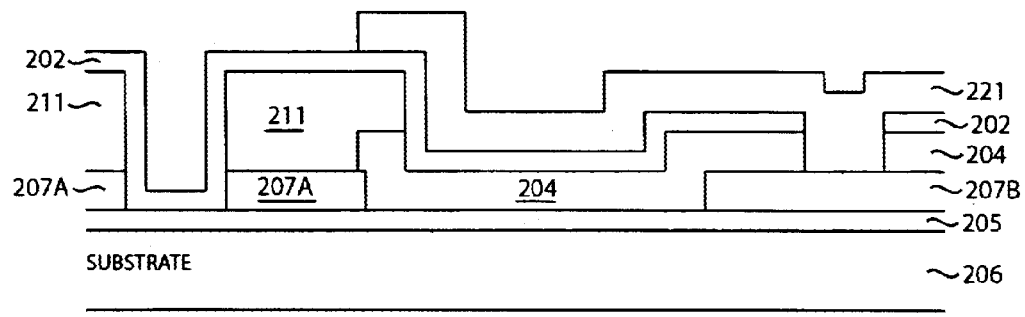

In FIG. 2(k), metal layer 221 is patterned and etched to remove portions of metal layer 221 over a metallic electrode 207A.

Figure 2L:
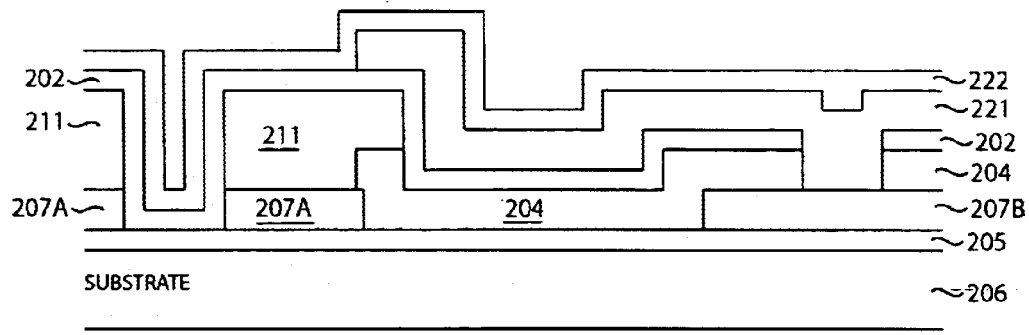

In FIG. 2(l), metal layer 222 is deposited over the sample of FIG. 2(k). Because portions of metal layer 222 is relatively thin compared to a metal layer 221. In one embodiment, metal layer 222 comprises aluminum deposited to a thickness of 750 Angstroms by physical vapor deposition.

Figure 2M:
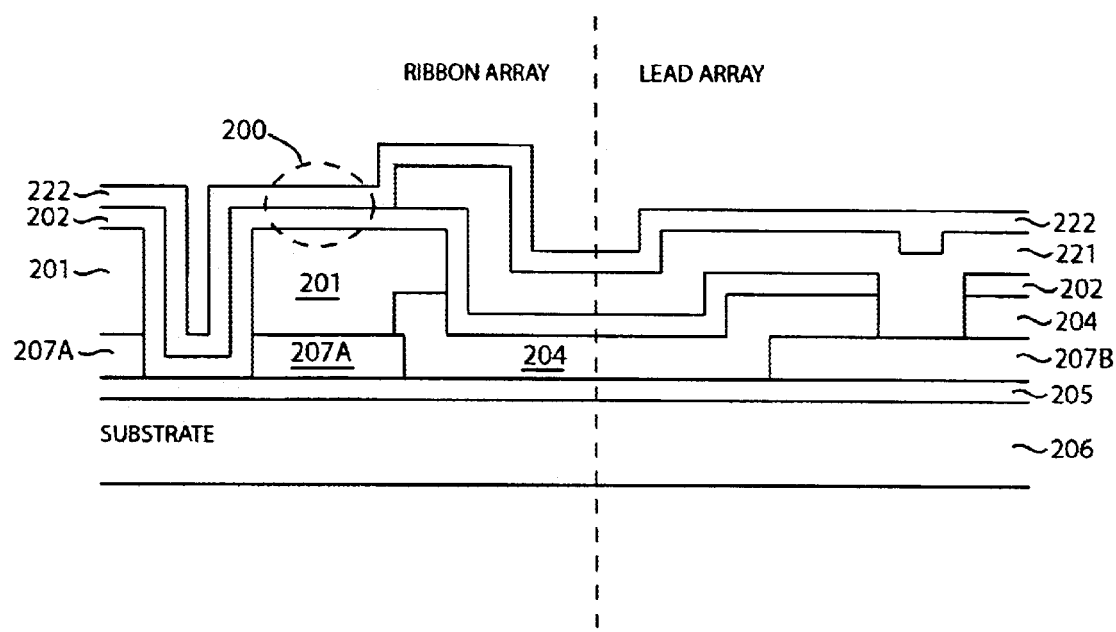

In FIG. 2(m), portions of sacrificial layer 211 between a metallic electrode 207A and ribbon material 202 are removed using the metallic electrode 207A as an etch stop. This etching step results in the formation of air gaps 201. In one embodiment, a sacrificial layer 211 of amorphous silicon is removed by placing the sample of FIG. 2(l) in an environment including a noble gas fluoride. Preferably, the noble gas fluoride includes xenon difluoride. Other noble gas fluorides that may be used include those of krypton and argon. It is to be noted that xenon difluoride has been used as an etchant in micro-electromechanical systems (MEMS). For example, U.S. Pat. No. 5,726,480 issued to Pister discloses the use of xenon difluoride in the fabrication of MEMS devices. U.S. application Ser. No. 09/952,626, entitles "MICROELECTRONIC MECHANICAL SYSTEM AND METHODS", filed by Mike Bruner on Sept. 13, 2001, also discloses the use of xenon difluoride as an etchant. The aforementioned disclosures by Pister and Bruner are incorporated herein by reference in their entirety.

As shown in FIG. 2(m), a metallic electrode 207A is formed under a ribbon 200 comprising ribbon material 202 and metal layer 222. A ribbon 200 is identified in FIG. 2(m) by a dashed circle. A ribbon 200 is an example of a "moveable structure" because it may be flexed towards a metallic electrode 207A upon application of a voltage difference between the metallic electrode 207A and the ribbon 200. Controlling the voltage difference allows modulation of light incident on metal layer 222.

In FIG. 2(m), metal layer 222 serves as a top electrode while a metallic electrode 207A serves as a bottom electrode. To apply a voltage difference between a ribbon 200 and a metallic electrode 207A, a voltage may be applied on metal layer 222 while substrate 206 is held at ground potential. Voltage may be applied on metal layer 222 by applying the voltage on a lead (e.g., interconnect line or wire; not show) coupled to metallic electrode 207B, which is coupled to metal layer 221, which in turn is coupled to metal layer 222 as shown in FIG. 2(m). Metallic electrode 207B may be a metal pad coupled to a lead array that allows an external control signal, such as a voltage, to be applied on metal layer 222. Note that unlike a conventional ribbon, ribbon 200 employs a metallic bottom electrode with no dielectric coating to help prevent charge build up in the bottom electrode. Among other advantages, this allows for a more stable driving characteristic.

Figure 3:
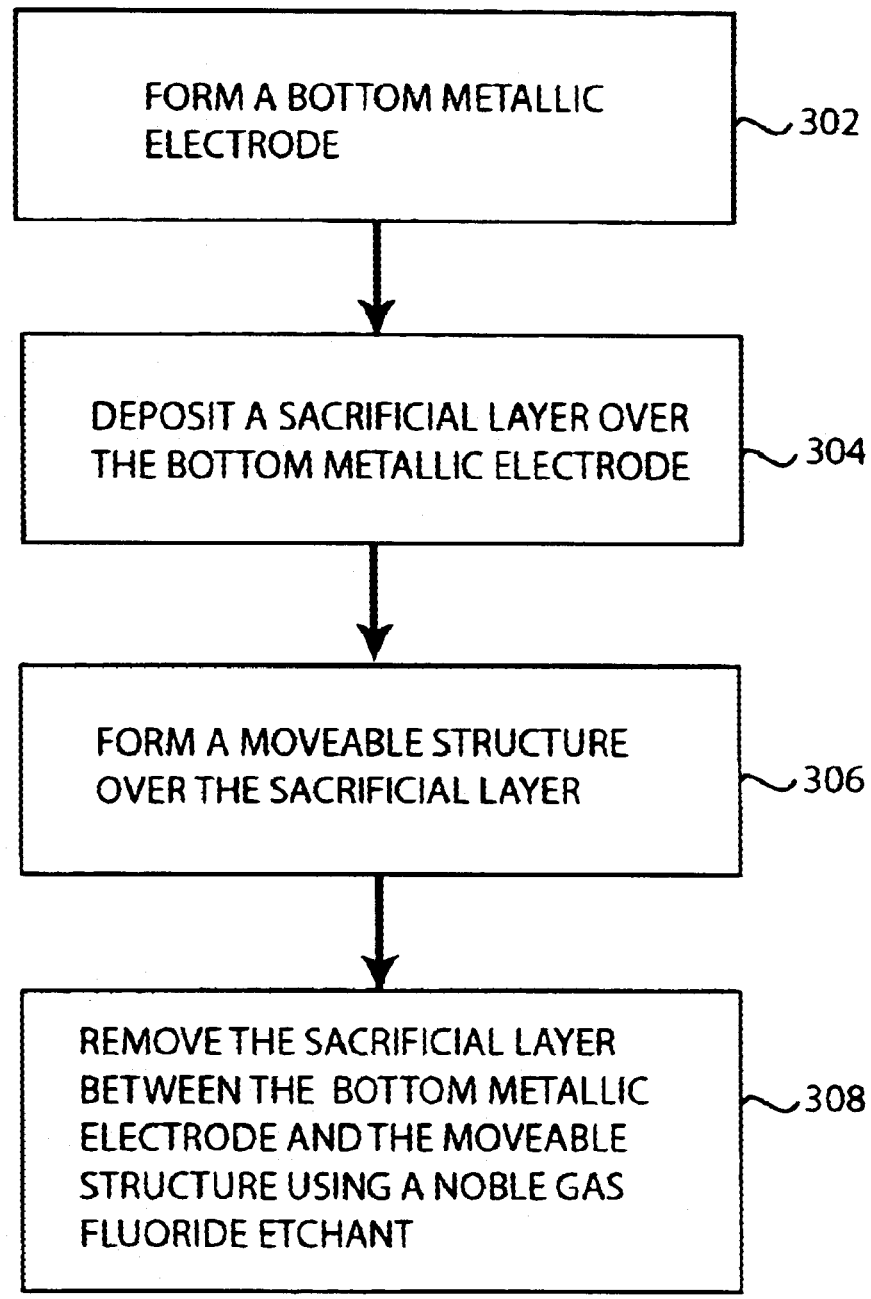
FIG. 3 shows a flow diagram of a method of forming a micro device in accordance with an embodiment of the present invention.

FIG. 3 shows a flow diagram of a method of forming a micro device in accordance with an embodiment of the present invention. In step 302, a bottom metallic electrode (e.g., metallic electrode 207A) is formed over a substrate.

In step 304, a sacrificial layer (e.g., sacrificial layer 211) is deposited over the bottom metallic electrode.

In step 306, a moveable structure (e.g., ribbon 200) is formed over the sacrificial layer. The moveable structure may include a resilient structure (e.g., ribbon material 202) and a top metallic electrode (e.g., metal layer 222) over the resilient structure.

In step 308, the sacrificial layer between the moveable structure and the bottom metallic electrode is removed using a noble gas fluoride etchant. This results in an air gap that allows the moveable structure to flex towards the bottom metallic electrode upon application of a control signal, such as a voltage.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method of forming a micro device, the method comprising:
   depositing a sacrificial layer over a first metallic electrode;
   forming a moveable structure over the sacrificial layer; and
   etching the sacrificial layer between the moveable structure and the first metallic electrode with a noble gas fluoride so as to form an air gap between the first metallic electrode and the moveable structure.

2. The method of claim 1 wherein the first metallic electrode comprises titanium-nitride.

3. The method of claim 1 wherein the sacrificial layer is deposited at a temperature greater than about 500° C.

4. The method of claim 1 wherein the sacrificial layer comprises amorphous silicon.

5. The method of claim 1 wherein the noble gas fluoride comprises xenon difluoride.

6. The method of claim 1 wherein forming the moveable structure over the sacrificial layer comprises:
   depositing a ribbon material over the sacrificial layer; and
   depositing a metal over the ribbon material.

7. The method of claim 6 wherein the ribbon material comprises silicon nitride.

8. The method of claim 6 wherein the metal comprises aluminum.

9. The method of claim 1 wherein the first metallic electrode is of a material that is stable at least up to about 900° C.

10. The method of claim 1 further comprising:

forming the first metallic electrode by depositing titanium over a substrate and exposing the titanium to an environmental including ammonia.

11. A method of forming a micro device, the method comprising the steps of:

step for depositing a sacrificial layer over a first metallic electrode; and step for isotropically etching the sacrificial layer with a noble gas fluoride so as to form an air gap between the first metallic electrode and a moveable structure.

12. The method of claim 11 wherein the step for depositing the sacrificial layer comprises depositing an amorphous silicon layer over the first metallic electrode.

13. The method of claim 11 wherein the moveable structure comprises:

a resilient structure over the sacrificial layer; and a second metallic electrode over the resilient structure.

14. A method of fabricating a micro electromechanical system (MEMS) structure, the method comprising:

forming a sacrificial layer over a bottom metallic electrode comprising titanium-nitride;

forming a layer of resilient material over the sacrificial layer; and isotropically etching the sacrificial layer to form an air gap between the layer of resilient material and the bottom metallic electrode.

15. The method of claim 14 wherein the sacrificial layer comprises amorphous silicon and is isotropically etched using a noble gas fluoride.

16. The method of claim 15 wherein the noble gas fluoride comprises xenon difluoride.

17. The method of claim 14 further comprising:

forming a top metallic electrode over the resilient material such that the top metallic electrode and the resilient material form a ribbon that is moveable to the bottom metallic electrode upon application of voltage difference between the top and bottom metallic electrodes.

18. The method of claim 14 wherein the resilient material comprises silicon nitride.

* * * * *

UNITED STATES PATENT AND TRADEMARK OFFICE
CERTIFICATE OF CORRECTION

PATENT NO. : 6,777,258 B1
DATED : August 17, 2004
INVENTOR(S) : Hunter

It is certified that error appears in the above-identified patent and that said Letters Patent is hereby corrected as shown below:

Column 6,
Lines 39-48, claim 1 should read,
-- 1. A method of forming a micro device, the method comprising:
depositing a layer of material over a substrate;
forming a first metallic electrode over the layer of material;
depositing a sacrificial layer over the first metallic electrode;
forming a moveable structure over the sacrificial layer; and
etching the sacrificial layer between the moveable structure and the first metallic electrode with a noble gas fluoride using the first metallic electrode as an etch stop protecting the layer of material so as to form an air gap between the first metallic electrode and the moveable structure. --

Column 7,
Lines 5-11, claim 11 should read,
-- 11. A method of forming a micro device, the method comprising the steps of:
step for depositing a layer of material over a substrate;
step for depositing a first metallic electrode over the layer of material;
step for depositing a sacrificial layer over the first metallic electrode; and
step for etching the sacrifical layer with a noble gas fluoride using the first metallic electrode as an etch stop protecting the layer of material so as to form an air gap between the first metallic electrode and a moveable structure. --

Column 7, line 19 - Column 8, line 5,
Claim 14 should read,
-- 14. A method of fabricating a micro electromechanial system (MEMS) structure, the method comprising:
depositing an isolation layer over a substrate;
depositing a bottom electrode over the isolation layer;
forming a sacrificial layer over the bottom metallic electrode comprising titanium-nitride;
forming a layer of resilient material over the sacrificial layer; and
etching the sacrificial layer using the bottom electrode as an etch stop protecting the isolation layer to form an air gap between the layer of resilient material and the bottom metallic electrode. --

UNITED STATES PATENT AND TRADEMARK OFFICE
CERTIFICATE OF CORRECTION

PATENT NO. : 6,777,258 B1
DATED : August 17, 2004
INVENTOR(S) : Hunter

It is certified that error appears in the above-identified patent and that said Letters Patent is hereby corrected as shown below:

Column 8,
Lines 28-30, claim 15 should read,
-- 15. The method of claim 21 wherein the sacrificial layer comprises amorphous silicon and is etched using a noble gas fluoride. --

Signed and Sealed this

Thirty-first Day of May, 2005

JON W. DUDAS
*Director of the United States Patent and Trademark Office*